United States Patent
Wong et al.

(10) Patent No.: US 9,871,030 B2
(45) Date of Patent: Jan. 16, 2018

(54) PLASMA PROTECTION DIODE FOR A HEMT DEVICE

(71) Applicant: Taiwan Semiconductor Manufacturing Company, LTD., Hsin-Chu (TW)

(72) Inventors: King-Yuen Wong, Hong Kong (CN); Chun-Wei Hsu, Taichung (TW); Chen-Ju Yu, Jiaoxi Township (TW); Fu-Wei Yao, Hsinchu (TW); Jiun-Lei Jerry Yu, Zhudong Township (TW); Fu-Chih Yang, Fengshan (TW); Po-Chih Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/357,308

(22) Filed: Nov. 21, 2016

(65) Prior Publication Data

US 2017/0069617 A1   Mar. 9, 2017

Related U.S. Application Data

(60) Continuation of application No. 14/872,197, filed on Oct. 1, 2015, now Pat. No. 9,502,311, which is a
(Continued)

(51) Int. Cl.
| | |
|---|---|
| *H01L 27/02* | (2006.01) |
| *H01L 29/66* | (2006.01) |
| *H01L 29/778* | (2006.01) |
| *H01L 29/10* | (2006.01) |
| *H01L 29/20* | (2006.01) |
| *H01L 21/8252* | (2006.01) |
| *H01L 27/06* | (2006.01) |

(Continued)

(52) U.S. Cl.
CPC ...... *H01L 27/0255* (2013.01); *H01L 21/0254* (2013.01); *H01L 21/02381* (2013.01); *H01L 21/26513* (2013.01); *H01L 21/26546* (2013.01); *H01L 21/30612* (2013.01); *H01L 21/76877* (2013.01); *H01L 21/76898* (2013.01); *H01L 21/8252* (2013.01); *H01L 21/8258* (2013.01); *H01L 23/5226* (2013.01); *H01L 27/0605* (2013.01); *H01L 29/1075* (2013.01); *H01L 29/2003* (2013.01); *H01L 29/205* (2013.01);
(Continued)

(58) Field of Classification Search
CPC ............ H01L 29/2003; H01L 27/0255; H01L 29/7787; H01L 21/743; H01L 21/8252
See application file for complete search history.

(56) References Cited

U.S. PATENT DOCUMENTS

| | | | | |
|---|---|---|---|---|
| 5,986,308 A | * | 11/1999 | Gradenwitz | ........ H01L 27/0255 257/356 |
| 8,492,773 B2 | * | 7/2013 | Hebert | ................ H01L 21/8258 257/77 |

(Continued)

*Primary Examiner* — Jaehwan Oh
(74) *Attorney, Agent, or Firm* — Haynes and Boone, LLP

(57) ABSTRACT

A silicon substrate having a III-V compound layer disposed thereon is provided. A diode is formed in the silicon substrate through an ion implantation process. The diode is formed proximate to an interface between the silicon substrate and the III-V compound layer. An opening is etched through the III-V compound layer to expose the diode. The opening is filled with a conductive material. Thereby, a via is formed that is coupled to the diode. A High Electron Mobility Transistor (HEMT) device is formed at least partially in the III-V compound layer.

20 Claims, 16 Drawing Sheets

Related U.S. Application Data division of application No. 13/418,538, filed on Mar. 13, 2012, now Pat. No. 9,165,839.

(51) Int. Cl.
    *H01L 21/02*     (2006.01)
    *H01L 21/265*     (2006.01)
    *H01L 21/306*     (2006.01)
    *H01L 21/768*     (2006.01)
    *H01L 21/8258*     (2006.01)
    *H01L 23/522*     (2006.01)
    *H01L 29/205*     (2006.01)
    *H01L 29/861*     (2006.01)

(52) U.S. Cl.
    CPC .... *H01L 29/6609* (2013.01); *H01L 29/66462* (2013.01); *H01L 29/7787* (2013.01); *H01L 29/861* (2013.01)

(56) References Cited

U.S. PATENT DOCUMENTS

| | | | |
|---|---|---|---|
| 8,557,644 B2* | 10/2013 | Briere | H01L 21/8221 257/195 |
| 8,637,360 B2 | 1/2014 | Hebert | |
| 8,723,234 B2 | 5/2014 | Takada et al. | |
| 8,829,621 B2 | 9/2014 | Zhu et al. | |
| 2011/0260174 A1* | 10/2011 | Hebert | H01L 21/8258 257/77 |
| 2011/0260216 A1* | 10/2011 | Hebert | H01L 21/8258 257/194 |
| 2012/0153300 A1* | 6/2012 | Lidow | H01L 21/743 257/77 |
| 2012/0228632 A1* | 9/2012 | Takada | H01L 21/8213 257/77 |
| 2013/0200456 A1* | 8/2013 | Zhu | H01L 21/762 257/347 |

* cited by examiner

PLASMA PROTECTION DIODE FOR A HEMT DEVICE

PRIORITY DATA

The present application is a continuation application of U.S. patent application Ser. No. 14/872,197, filed Oct. 1, 2015 which is a divisional application of U.S. patent application Ser. No. 13/418,538, filed on Mar. 13, 2012, the disclosure of both applications which are hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Technological advances in IC materials and design have produced various types of ICs that serve different purposes. The fabrication of some types of ICs may require forming a III-V compound layer on a substrate, for example forming a gallium nitride layer on a substrate. These types of IC devices may include high electron mobility transistor (HEMT) devices. However, back-end processes for fabricating a HEMT device typically includes a plurality of plasma-enhanced processes. The processes involve plasma charges that may damage components of the HEMT device, for example a gate component of the HEMT device. When this occurs, the HEMT device may become defective or have degraded performance.

Therefore, while existing methods of fabricating HEMT devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
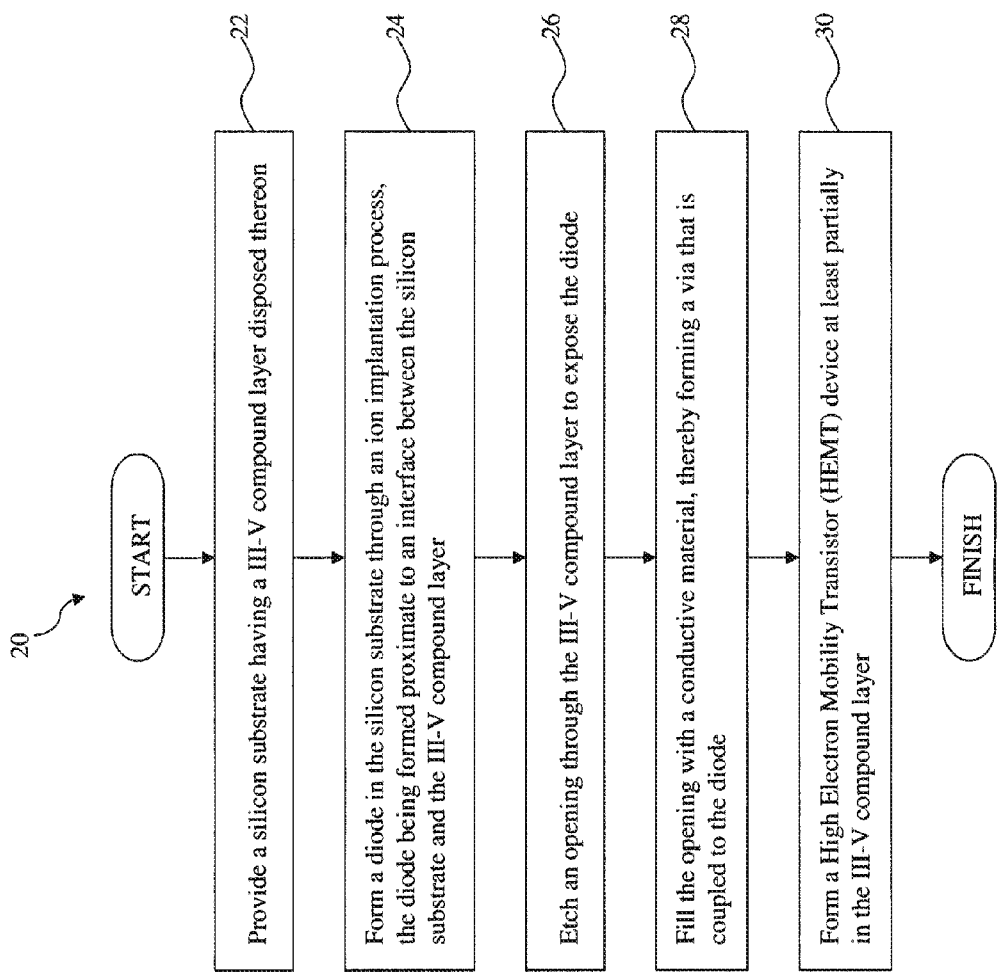
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As semiconductor fabrication technologies continue to advance, compound materials have been utilized to produce a variety of devices, such as high electron mobility transistor (HEMT) devices. A compound material includes a compound that contains an element from a "III" group (or family) of the periodic table, and another element from a "V" group (or family) of the periodic table. For example, the III group elements may include boron (B), aluminum (Al), gallium (Ga), indium (In), and titanium (Ti), and the V group elements may include nitrogen, phosphorous, arsenic, antimony, and bismuth.

Traditionally, III-V compound materials have been grown on sapphire substrates. However, sapphire substrates are expensive. In comparison, silicon substrates are cheaper and have been used as the substrate on which semiconductor devices are formed for many years. Hence, it is desirable to use silicon substrates as the substrates for growing compound materials. The fabrication of HEMT devices typically involves a number of plasma-enhanced processes, for example contact etching processes. The plasma charges resulting from these processes may cause damage to HEMT devices, for example to a gate component of a HEMT device. Some existing methods of protecting the HEMT devices from plasma-induced-damages involve juniper insertion, which may break the gate into different wires to reduce the amount of charge accumulated on each wire during fabrication. However, the jumper insertion method causes routing obstruction and is therefore cumbersome and inefficient. According to various aspects of the present disclosure, described below is a method of fabricating a diode that protects the HEMT devices from plasma-induced-damages.

Illustrated in FIG. 1 is a flowchart of a method 20 for fabricating a semiconductor device according to various aspects of the present disclosure. Referring to FIG. 1, the method 20 begins with block 22, in which a silicon substrate is provided. The silicon substrate has a III-V compound layer disposed thereon. In some embodiments, the III-V compound layer includes a gallium nitride sub-layer and an aluminum gallium nitride sub-layer disposed over the gallium nitride sub-layer. The method 22 continues with block 24, in which a diode is formed in the silicon substrate through an ion implantation process. The diode is formed proximate to an interface between the silicon substrate and the III-V compound layer. The method 20 continues with block 26, in which an opening is etched through the III-V compound layer to expose the diode. The method 20 continues with block 28, in which the opening is filled with a conductive material, thereby forming a via that is coupled to the diode. The method 20 continues with block 30, in which a High Electron Mobility Transistor (HEMT) device is formed at least partially in the III-V compound layer. In some embodiments, the forming the HEMT device includes: etching recesses in the III-V compound layer; filling these recesses with a conductive material, thereby forming source/drain components of the HEMT device; and forming a gate component of the HEMT device over the III-V compound layer and between the source/drain components. In some embodiments, the via is electrically coupled to a gate component of the HEMT device. In other embodiments, the via is electrically coupled to a source component of the HEMT device. In yet further embodiments, the via is electrically coupled to a metal contact pad disposed over the III-V compound layer, wherein the metal contact pad at least partially surrounds the HEMT device.

FIGS. 2 to 5 are diagrammatic fragmentary cross-sectional side views of a portion of a semiconductor device at various fabrication stages. It is understood that FIGS. 2 to 5 have been simplified for a better understanding of the inventive concepts of the present disclosure. Accordingly, it should be noted that additional processes may be provided before, during, and after the method illustrated in FIGS. 2-5, and that some other processes may only be briefly described herein.

Figure 2:
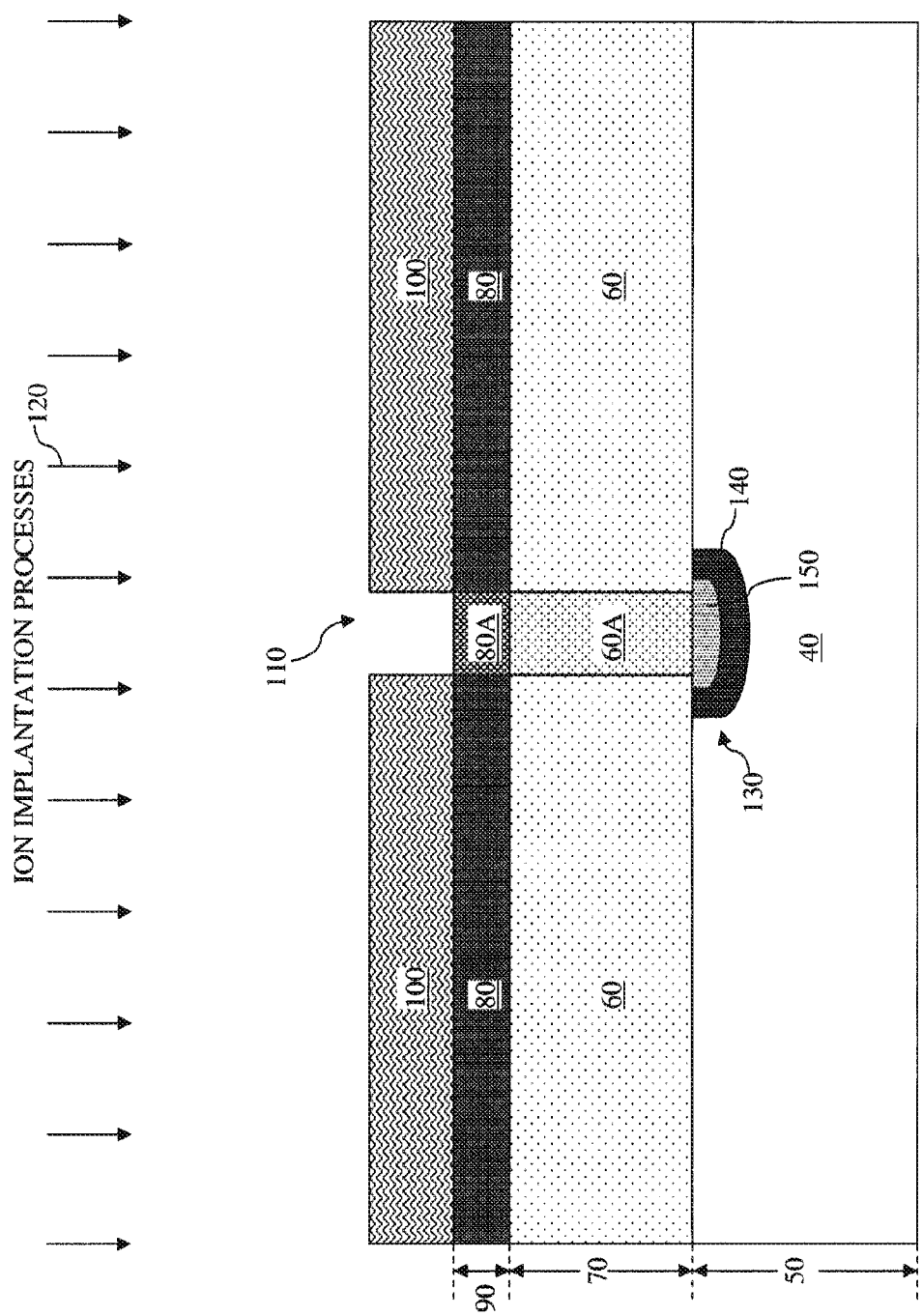
FIGS. 2-5 are diagrammatic fragmentary cross-sectional side views of a semiconductor device at various stages of fabrication in accordance with various aspects of the present disclosure.

Referring to FIG. 2, a silicon wafer 40 is provided. The silicon wafer 40 may also be referred to as a silicon substrate 40. The silicon wafer 40 has a thickness 50. In an embodiment, the thickness 50 is in a range from about 500 microns (um) to about 1000 um. In some embodiments, the surfaces of the silicon wafer 40 may be silicon (111) surfaces. The silicon (111) surface is obtained by cleaving or cutting the silicon along a (111) lattice plane defined according to a Miller Index. The silicon wafer 40 is chosen to have the silicon (111) surface in certain embodiments because the silicon (111) surface has a relatively small lattice mismatch with a buffer layer to be formed on the silicon (111) surface. Had a different silicon surface been used, such as a silicon (100) surface, the lattice mismatch between the silicon (100) surface and the buffer layer would have been greater and consequently would have led to more fabrication difficulties.

A III-V compound layer 60 is formed over the silicon substrate. The III-V compound layer 60 may also be referred to as a buffer layer. In some embodiments, the III-V compound layer 60 contains a gallium nitride (GaN) material. The III-V compound layer 60 has a thickness 70. In some embodiments, the thickness 70 is in a range from about 1 micrometer (um) to about 8 um. In some embodiments, the III-V compound layer 60 is formed by a suitable epitaxial growth process. In certain embodiments, the epitaxial growth process is performed at a temperature in a range from about 1000 degrees Celsius to about 1300 degrees Celsius, and for a process duration time in a range from about 8 hours to about 10 hours.

A III-V compound layer 80 is formed over the III-V compound layer 60. In some embodiments, the III-V compound layer 80 contains an aluminum gallium nitride (AlGaN) material. The III-V compound layer 80 has a thickness 90. In some embodiments, the thickness 90 is in a range from about 10 nanometers (nm) to about 40 nm. In some embodiments, the III-V compound layer 80 is formed by another epitaxial growth process. In certain embodiments, the epitaxial growth process is performed at a temperature in a range from about 1000 degrees Celsius to about 1300 degrees Celsius, and for a process duration time in a range from about 1 hour to about 2 hours.

It is understood that in various embodiments, additional buffer layers may be formed between the silicon wafer 40 and the III-V compound layer 60, or between the III-V compound layers 60 and 80. These additional buffer layers may further reduce the strain caused by the lattice mismatches. For reasons of simplicity, these additional buffer layers are not illustrated.

A patterned mask layer 100 is formed over the III-V compound layer 80. In some embodiments, the patterned mask layer 100 is a photoresist mask. The photoresist mask may be formed by a lithography process that includes one or more spin-on coating, exposing, developing, and baking processes. As a result of the lithography process, the patterned mask layer 100 contains an opening 110.

Ion implantation processes 120 is performed to form a protection diode 130 in the silicon substrate 40. The patterned mask 100 serves as an implant mask during the ion implantation processes 120. In other words, dopant ions are implanted through the opening 110 and through the III-V compound layers 60 and 80. Therefore, the protection diode 130 is at least partially vertically aligned with the opening 110. Due to effects such as dopant diffusion, the protection diode 130 has a greater lateral dimension (i.e., wider) than the opening 110. In some embodiments, the protection diode 130 is formed at or near an upper surface of the silicon substrate 40. It is also understood that the implantation processes 120 form doped regions 60A and 80A in the layers 60 and 80, respectively. The doped regions 60A and 80A are aligned with the opening 110.

The ion implantation processes 120 include a p-type ion implantation process to form a p-type region 140 and an n-type ion implantation process to form an n-type region 150. The p-type region 140 and the n-type region 150 collectively make up the protection diode 130. In some embodiments, the p-type ion implantation process has a p-type dopant such as boron (B) or $BF_2$, an implantation energy range between about 5 kilo-electron-volts (KeV) and about 20 KeV, and an implantation dose between about $1.0 \times 10^{12}$/centimeter$^2$ to about $1.0 \times 10^{15}$/centimeter$^2$, In some embodiments, the n-type ion implantation process has an n-type dopant such as arsenic (As) or phosphorous (P), an implantation energy range between about 5 KeV and about 30 KeV, and an implantation dose between about $1.0 \times 10^{12}$/centimeter$^2$ to about $1.0 \times 10^{15}$/centimeter$^2$. In alternative embodiments, the p-type region 140 and the n-type region may be reversed. In other alternative embodiments, the protection diode may only contain one doped region, whose dopant type is opposite than that of the silicon substrate. In other words, the p-n junction may be formed by the interface between the silicon substrate and the doped region. For example, if the silicon substrate is p-type doped, then the doped region may be an n-type doped region.

Figure 3:
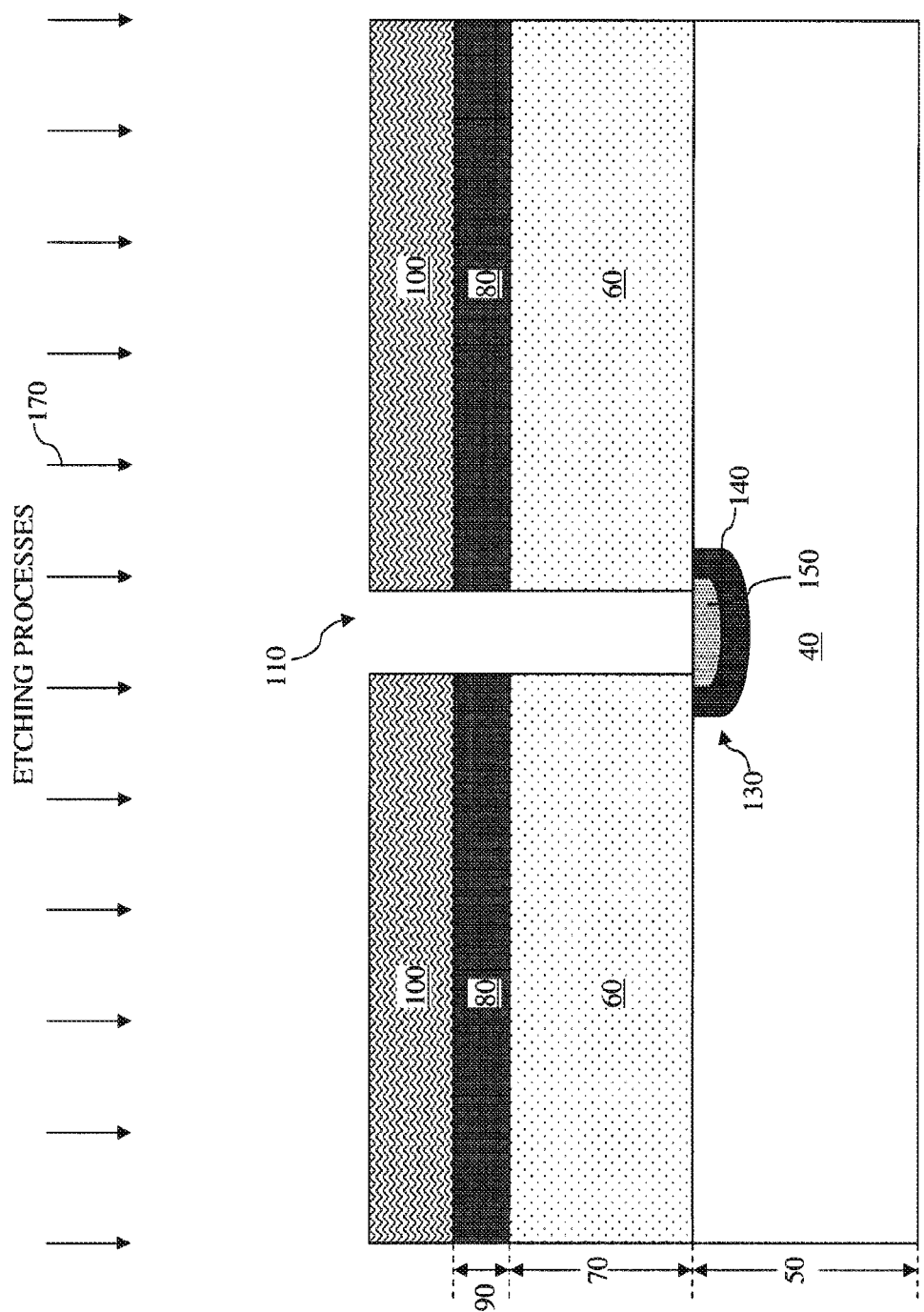

Referring now to FIG. 3, an etching process 170 is performed to remove portion of the III-V compound layers 60 and 80 below the opening 110. Stated differently, the etching process 170 extends the opening 110 downwards so that a portion of the protection diode 130 is exposed. The doped regions 60A and 80A of the layers 60 and 80 are removed. Thus, the n-type doped region 150 of the protection diode 150 is exposed by the opening 110. In some embodiments, the etching process 170 includes an inductively coupled plasma (ICP) etching process. In certain embodiments, the ICP etching process uses a chlorine gas ($Cl_2$) having a flow rate in a range from about 15 standard cubic centimeters per minute (sccm) to about 50 sccm, a helium gas (He) having a flow rate in a range from about 10 sccm to about 50 sccm, a pressure in a range from about 5 milli-torrs (mT) to about 50 mT, a radio-frequency (RF) coil power in a range from about 300 watts (W) to about 500 W, and an RF platen power in a range from about 100 W to about 300 W.

For purposes of improving conductivity, a silicide layer is formed on the exposed (i.e., exposed by the opening 110) surface of the silicon substrate 40. Thus, the silicide layer is formed over the protection diode 130 in some embodiments. The silicide layer is formed by depositing a metal material on the exposed surface of the silicon substrate 40, followed by an annealing process to make the metal material react with silicon to form a metal silicide, and thereafter removing un-reacted metal materials. In some embodiments, the metal material used to form the silicide layer is nickel (Ni), and thus the silicide layer is a nickel silicide (NiSi) layer. In some embodiments, the annealing process to facilitate the reaction between nickel and silicon is performed at a process temperature range between about 200 degrees Celsius and about 400 degrees Celsius, and for a process duration between about 1 minute to about 5 minutes. For the sake of simplicity, the silicide layer is not illustrated herein. It is understood that in some embodiments, the silicide layer may be optionally annealed again after the un-reacted metal materials are removed.

Figure 4:
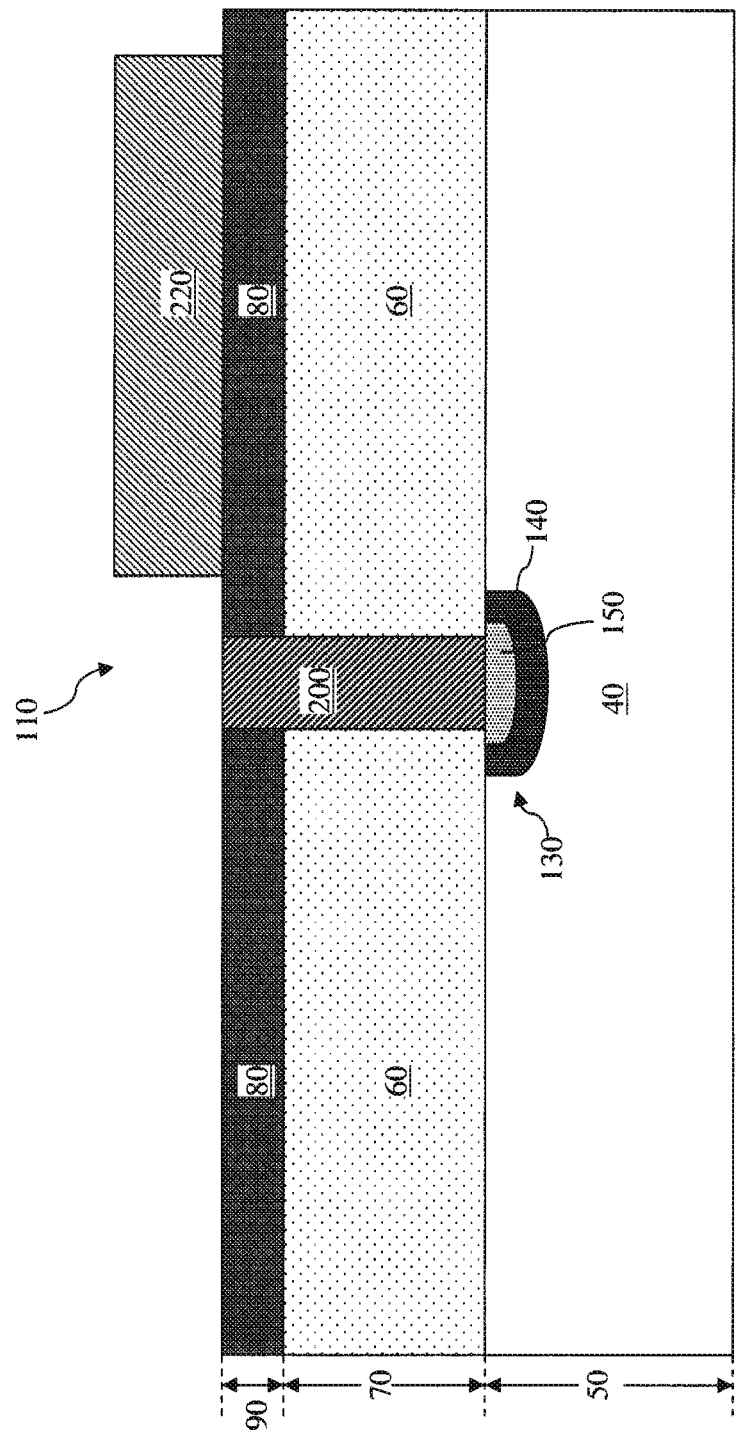

Referring now to FIG. 4, the patterned mask 100 is removed, and a via 200 is formed in the opening 110. The via 200 includes a conductive material, such as tungsten (W). In some embodiments, the via 200 may be formed by a deposition process followed by a polishing process. The via 200 is located over and electrically coupled to the protection diode 130. Specifically, the via 200 is electrically coupled to the n-type doped region 150 (i.e., the n-terminal) of the protection diode 130.

Thereafter, source and drain components 220 are formed over a portion of the III-V compound layer 80. The source and drain components 220 are components of a HEMT device, and they may also be referred to as Ohmic components. The source and drain components 220 are formed by etching a portion of the III-V compound layer 80 and filling the opening with a metal material, for example Ti, Al, Ni, gold (Au), or alloys thereof. The formation of the source and drain components 220 is not illustrated in FIG. 4, since the via 200 and the source and drain components 220 are not on the same cross-sectional plane. The relative disposition between the via 200 and the source and drain components 220 will be illustrated more clearly in the top view of FIG. 6.

Figure 5:
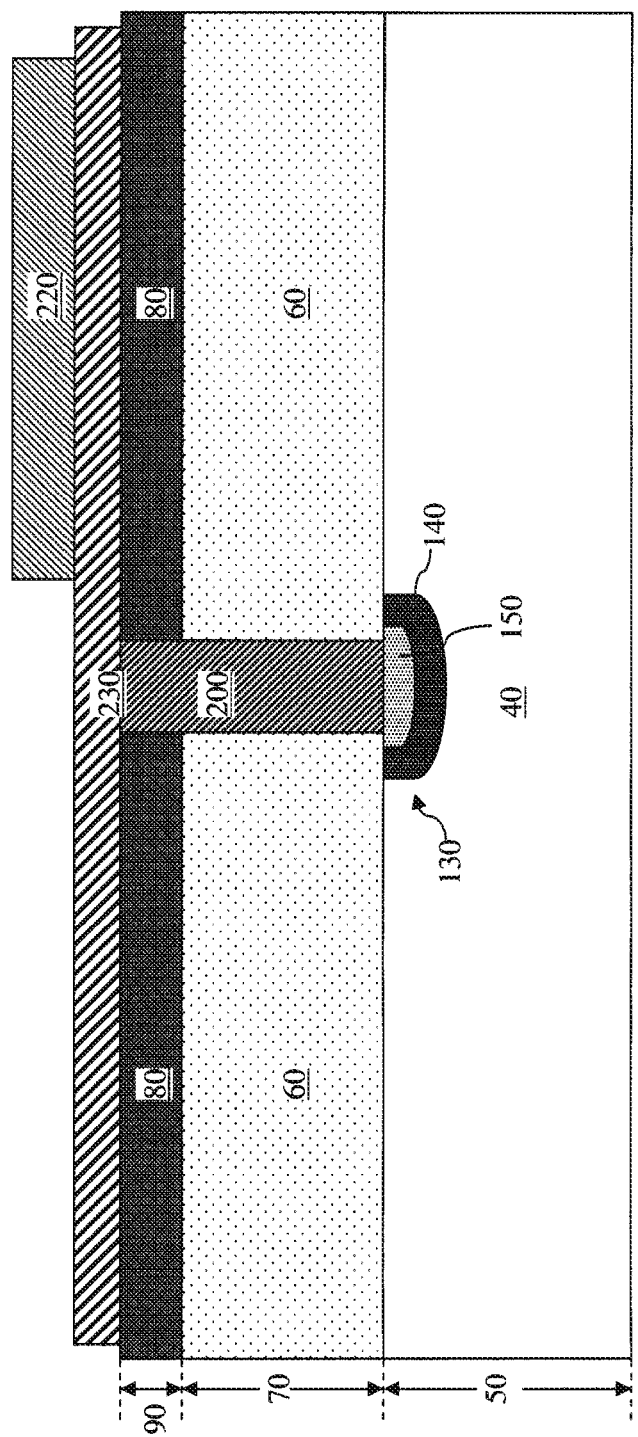

Referring now to FIG. 5, a gate component 230 of the HEMT device is formed over the III-V compound layer 80. The gate component 230 may includes a gate dielectric and a gate electrode. The gate electrode contains a conductive material, for example titanium nitride (TiN), tungsten nitride (WN), polysilicon, or an alloy of Ni and Au. The gate component 230 is formed on a different cross-sectional plane than the source and drain components 220, and thus the gate component 230 effectively "blocks" the view of a portion of the source and drain components 220 in FIG. 5. The gate component 220 is formed on the same cross-sectional plane as the via 200 and is electrically coupled to the via 200. Therefore, the gate component 230 is electrically coupled to the protection diode 130 through the via 200. The protection diode 130 normally is under reverse bias and therefore does not affect device operations. However, when there is a large amount of plasma charge (which may occur during a later plasma-enhanced fabrication process), the protection diode 130 turns on and diverts the plasma charge to the silicon substrate 40, thereby preventing plasma-induced damage to the HEMT device, for example preventing damage to the gate dielectric of the gate component 230.

Figure 6:
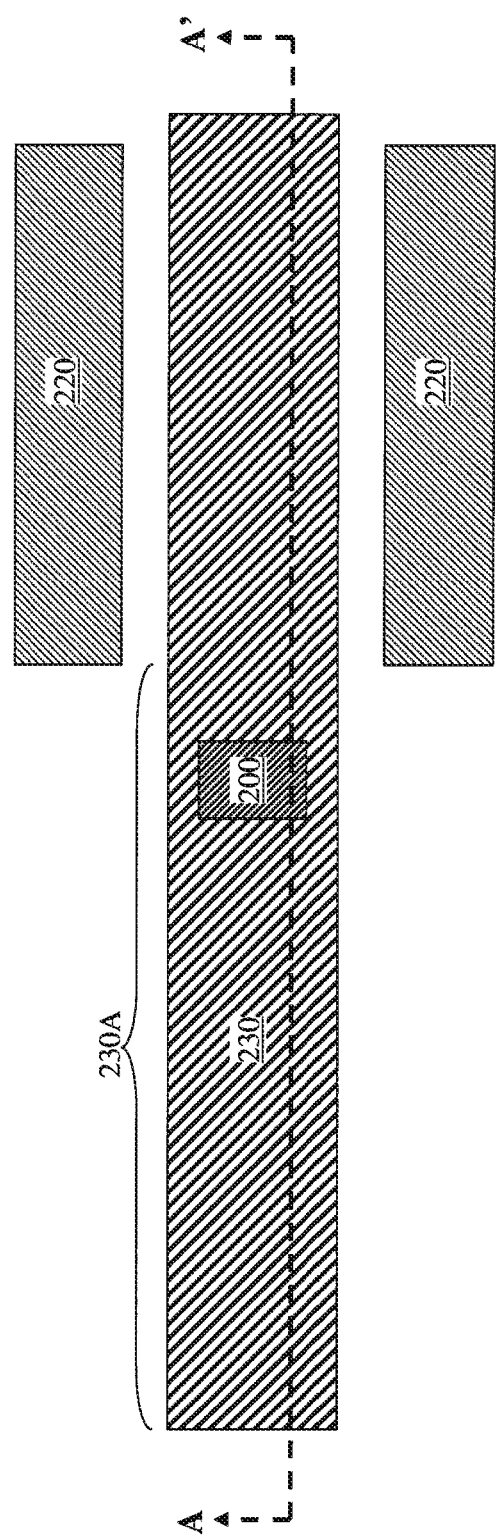
FIG. 6 is a diagrammatic fragmentary top view of a semiconductor device at a stage of fabrication in accordance with various aspects of the present disclosure.

Referring now to FIG. 6, which illustrates a top view of the semiconductor device of FIG. 5. The cross-sectional view of FIG. 5 is obtained by taking a cross-section cut from point A to A' in FIG. 6. From the top view, it is clear that the source and drain components 220 are not on the same cross-sectional plane (i.e., not intersected by the dashed line from A to A') as the via 200 or the gate component 230. Rather, one of the source and drain components 220 is located on one side of the gate 230, and the other one of the source and drain components 220 is located on the opposite side of the gate 230. The gate component 230 and the source and drain components 220 collectively make up the HEMT device. A portion 230A of the gate component 230 extends beyond the source and drain components 220. This portion 230A may be referred to as a gate extension segment 230A. In the illustrated embodiment, the via 200 (and therefore the un-illustrated protection diode 130) is coupled to the gate extension segment 230A.

FIGS. 2-6 illustrate an embodiment where the protection diode is coupled to the gate component of the HEMT device to prevent plasma-induced damage. FIGS. 7-11 illustrate an alternative embodiment where a protection diode is coupled to a source component of the HEMT device to prevent plasma-induced damage. For reasons of clarity and consistency, similar components are labeled the same throughout FIGS. 2-11.

Figure 7:
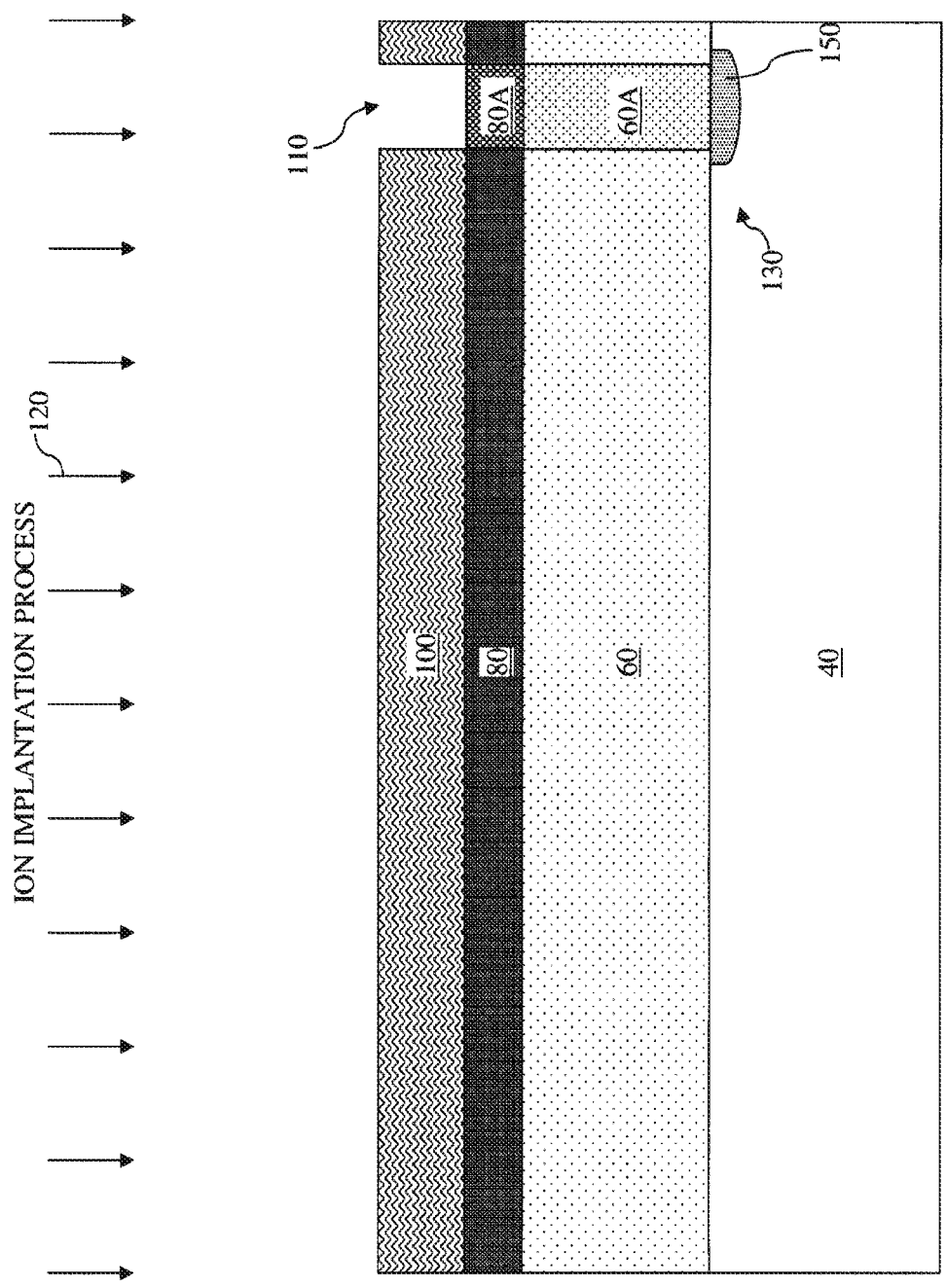
FIGS. 7-10 are diagrammatic fragmentary cross-sectional side views of a semiconductor device at various stages of fabrication in accordance with various aspects of the present disclosure.

Referring to FIG. 7, a silicon substrate 40 is provided. A III-V compound layer 60 is formed over the silicon substrate 40, and a III-V compound layer 80 is formed over the III-V compound layer 60. In certain embodiments, the III-V compound layer 60 contains GaN, and the III-V compound layer contains AlGaN. A patterned mask layer 100 is formed over the III-V compound layer 80. The patterned mask layer may contain a photoresist material and includes an opening 110. An ion implantation process 120 is performed through the opening 110 to form a protection diode 130 in the silicon substrate 40. In the illustrated embodiment, the protection diode 130 includes a doped region 150 that is oppositely doped (i.e., having a different type of conductivity) from the silicon substrate 40. Thus, in embodiments where the silicon substrate 40 is a p-type substrate, the doped region 150 is an n-type doped region, and vice versa. The p-n junction of the diode 130 is formed by an interface between the silicon substrate 40 and the doped region 150. In various embodiments, the lateral dimension of the opening 110 is smaller than that of the doped region 150. And as discussed above, the ion implantation processes 120 also form doped regions 60A and 80A in the layers 60 and 80, respectively. The doped regions 60A and 80A are aligned with the opening 110.

Figure 8:
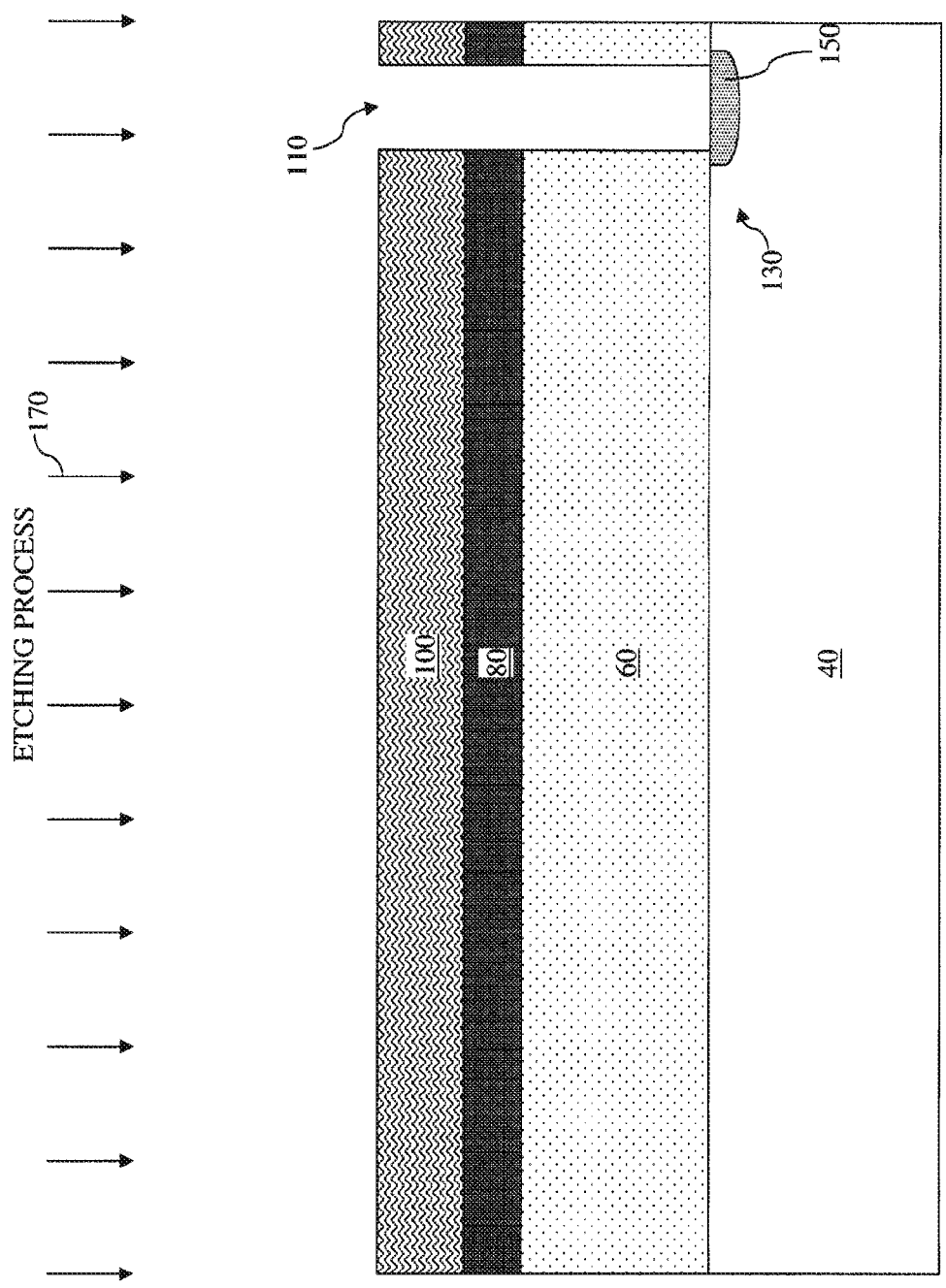

Referring now to FIG. 8, an etching process 170 is performed to extend the opening 110 downward so as to expose the doped region 150 of the protection diode 130. The doped regions 60A and 80A are removed by the etching process 170. Thereafter, a metal silicide layer (not illustrated herein) is formed on the exposed surfaces of the doped region 150. The metal silicide layer may be a NiSi layer and may be formed by a deposition process followed by an annealing process and an etching process. The NiSi layer may optionally undergo an additional annealing process.

Figure 9:
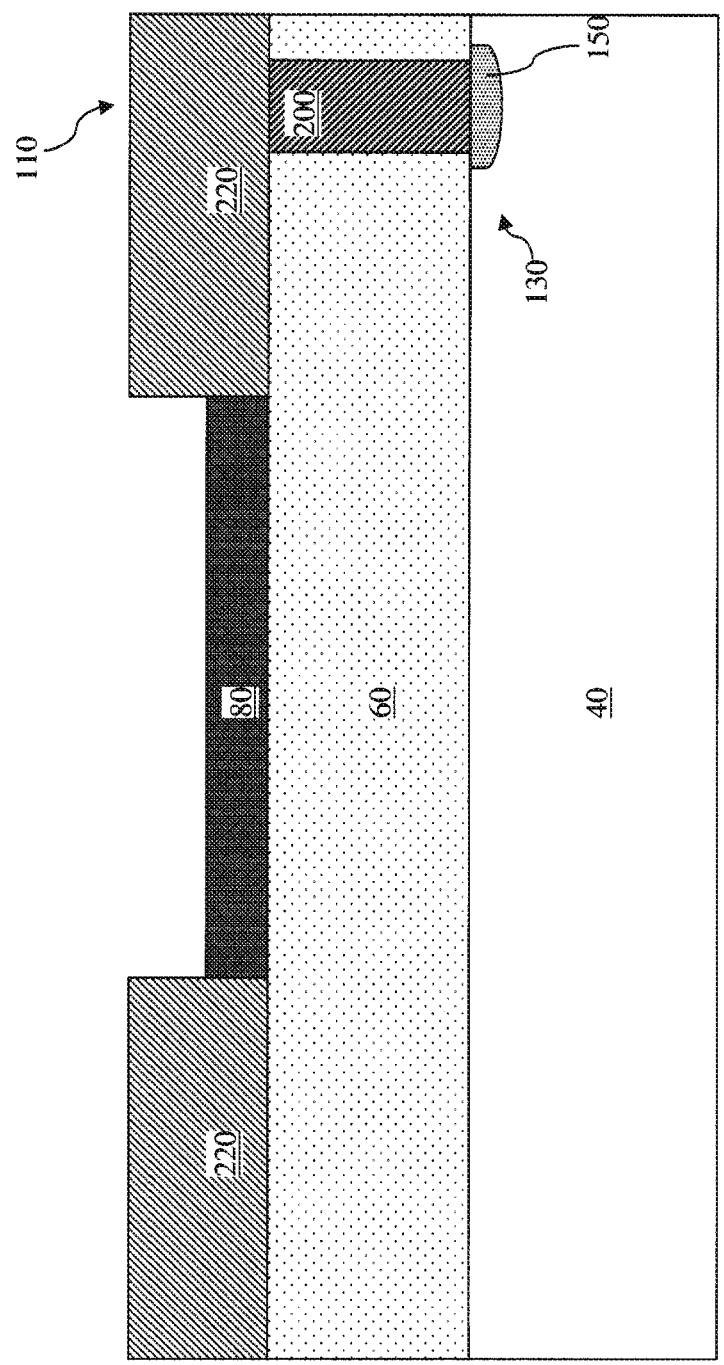

Referring now to FIG. 9, the patterned mask 100 is removed. The opening 110 is then filled with a conductive material to form a conductive via 200 that is electrically coupled to the protection diode 130, specifically to the doped region 150. Source and drain regions 220 of a HEMT device are then formed over the III-V compound layer 60. In some embodiments, the source and drain regions 220 are formed by etching openings in the III-V compound layer 60 and filling these openings with a conductive material such as a metal material. The source component 220 is electrically coupled to the via 200, and therefore electrically coupled to the protection diode 130. The protection diode 130 is normally reverse biased. However, when there is a large amount of plasma charge, the protection diode 130 turns on and diverts the charge to the silicon substrate 40, thereby preventing plasma-induced damage to the HEMT device.

Figure 10:
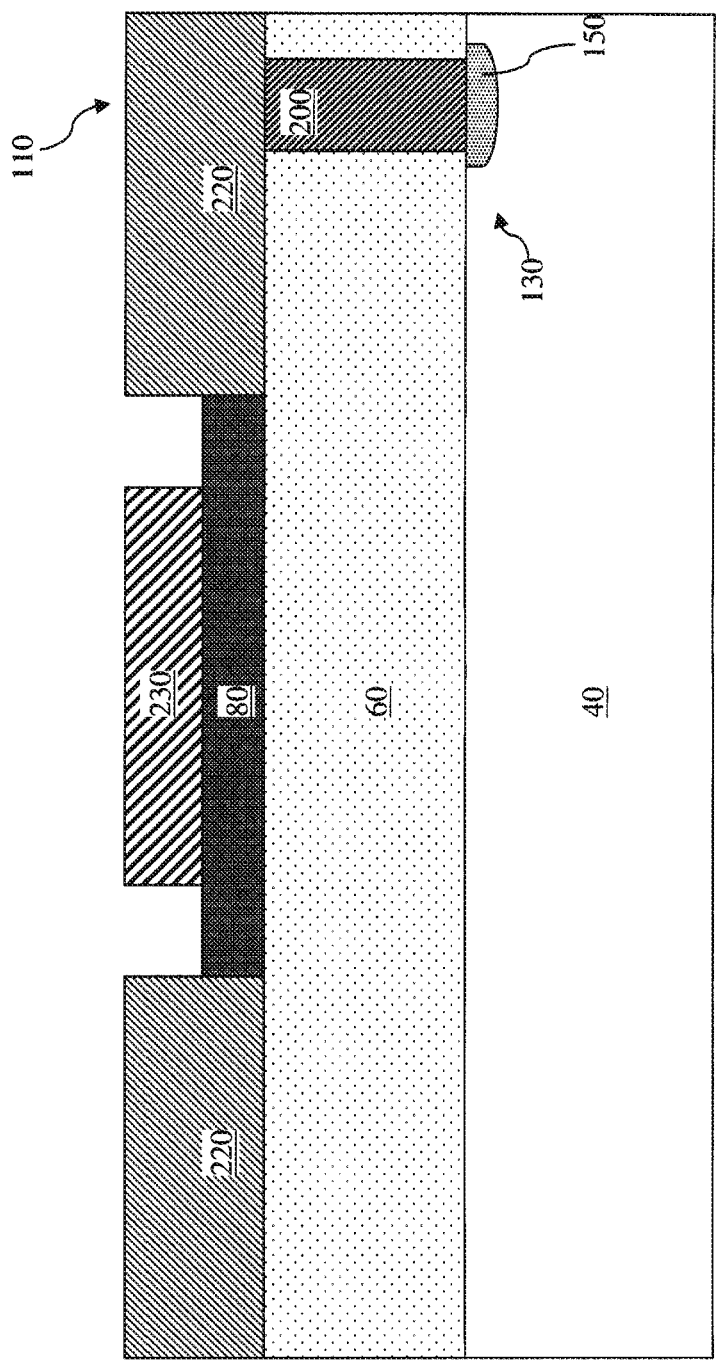

Referring now to FIG. 10, a gate component 230 of the HEMT device is formed over the III-V compound layer 80. The gate component 230 is formed between the source and drain components 220. The gate component 230 may include a gate dielectric and a conductive gate electrode.

Figure 11:
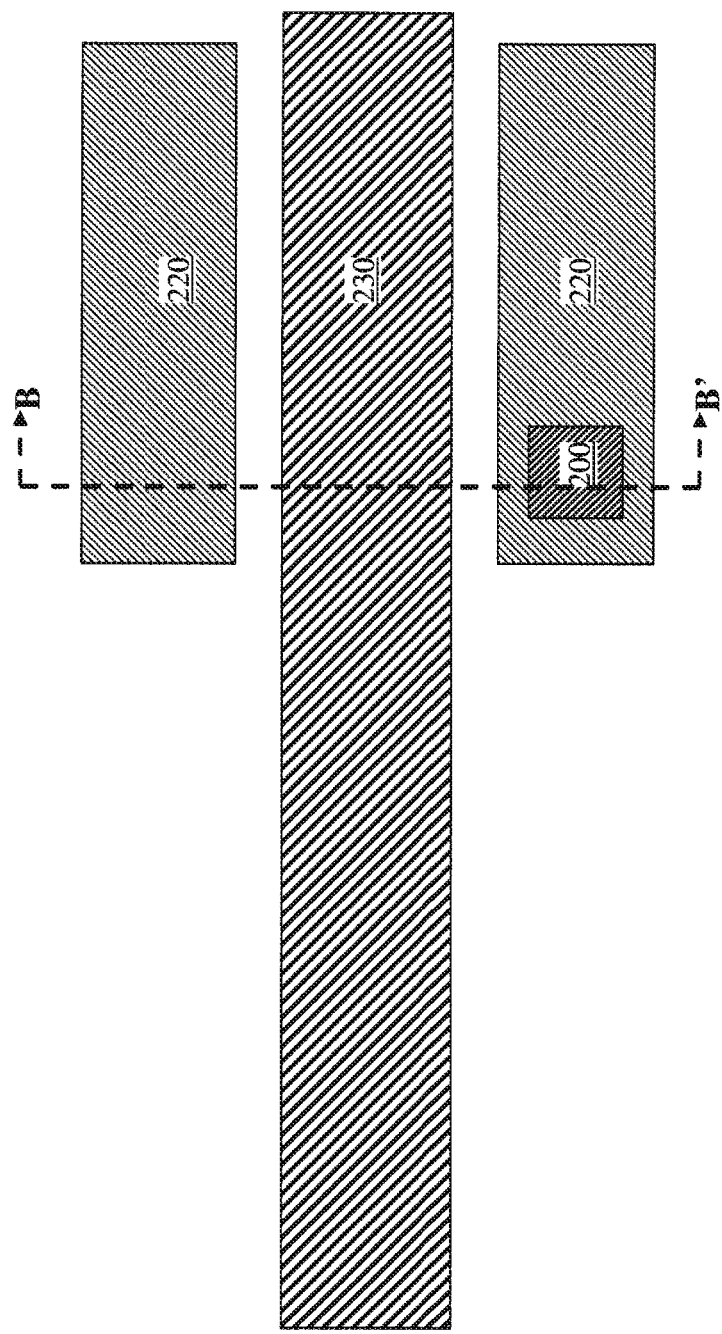
FIG. 11 is a diagrammatic fragmentary top view of a semiconductor device at a stage of fabrication in accordance with various aspects of the present disclosure.

FIG. 11 illustrates a top view of the semiconductor device of FIG. 10. The cross-sectional view of FIG. 10 is obtained by taking a cross-section cut from point B to B' in FIG. 11. From the top view, it is clear that the source and drain components 220 are on the same cross-sectional plane as the via 200. The via 200 is in fact coupled to the source component 220. The source component 220 is located on one side of the gate 230, and the drain component 220 is located on the opposite side of the gate 230. The gate component 230 and the source and drain components 220 collectively make up the HEMT device.

FIGS. 12-16 illustrate yet another alternative configuration where a protection diode is used to protect an HEMT device from plasma-induced damage. For reasons of clarity and consistency, similar components are labeled the same as they were in FIGS. 2-11.

Figure 12:
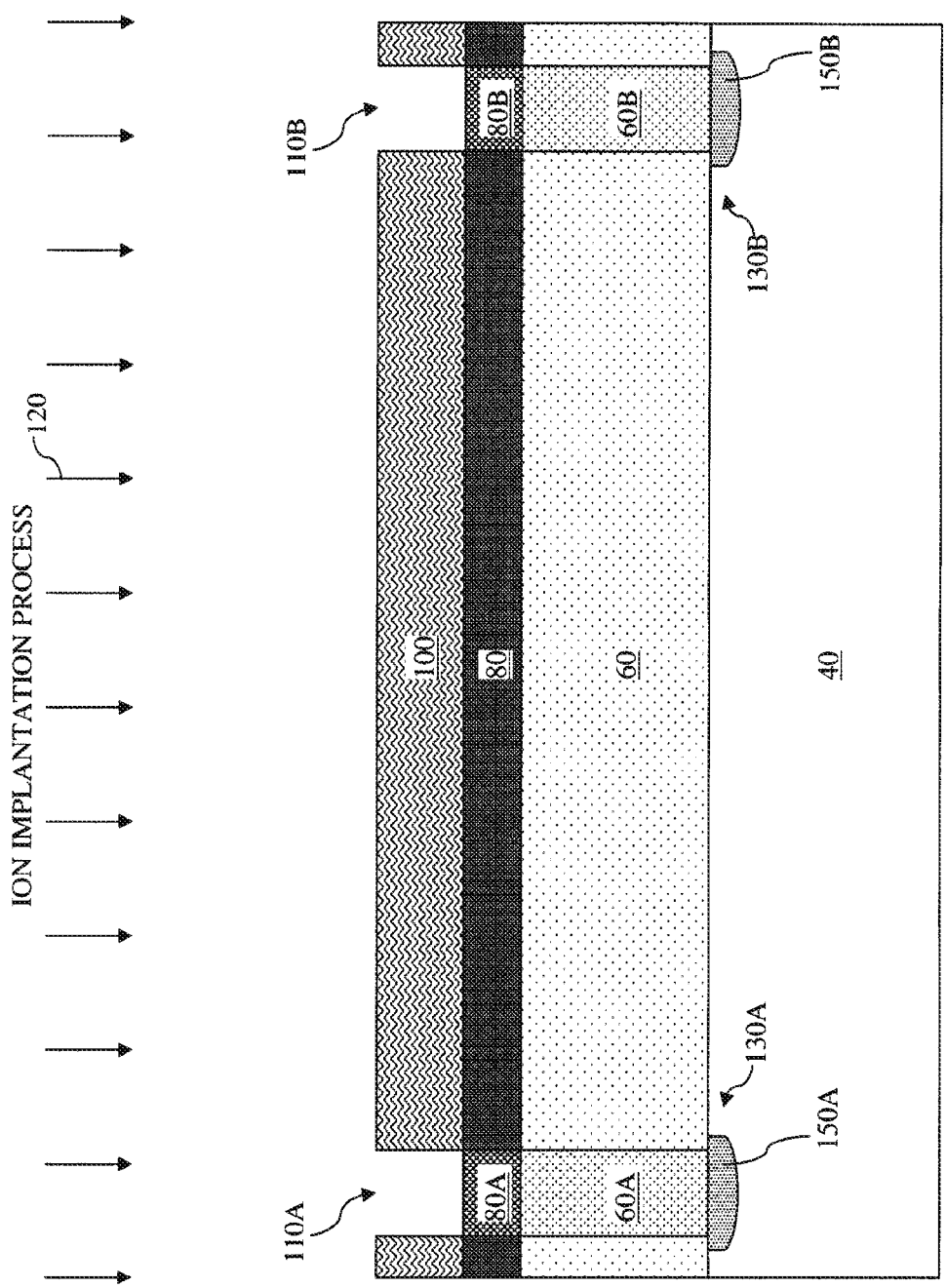
FIGS. 12-15 are diagrammatic fragmentary cross-sectional side views of a semiconductor device at various stages of fabrication in accordance with various aspects of the present disclosure.

Referring to FIG. 12, a silicon substrate 40 is provided. A III-V compound layer 60 is formed over the silicon substrate 40, and a III-V compound layer 80 is formed over the III-V compound layer 60. In certain embodiments, the III-V compound layer 60 contains GaN, and the III-V compound layer contains AlGaN. A patterned mask layer 100 is formed over the III-V compound layer 80. The patterned mask layer may contain a photoresist material and includes openings 110A-110B. An ion implantation process 120 is performed through the openings 110A-110B to form protection diodes 130A-130B in the silicon substrate 40. In the illustrated embodiment, the protection diodes 130A-130B include doped regions 150A-150B that are oppositely doped (i.e., having a different type of conductivity) from the silicon substrate 40. Thus, in embodiments where the silicon substrate 40 is a p-type substrate, the doped regions 150A-1509 are n-type doped regions, and vice versa. The p-n junction of the diodes 130A-130B is formed by an interface between the silicon substrate 40 and the doped regions 150A-150B. In various embodiments, the lateral dimension of the opening 110A-110B is smaller than that of the doped regions 150A-150B. As discussed above, the ion implantation processes 120 form doped regions 60A and 60B in the layer 60, and doped regions 80A and 80B in the layer 80. The doped regions 60A and 80A are aligned with the opening 110A, and doped regions 60B and 80B are aligned with the opening 110B.

Figure 13:
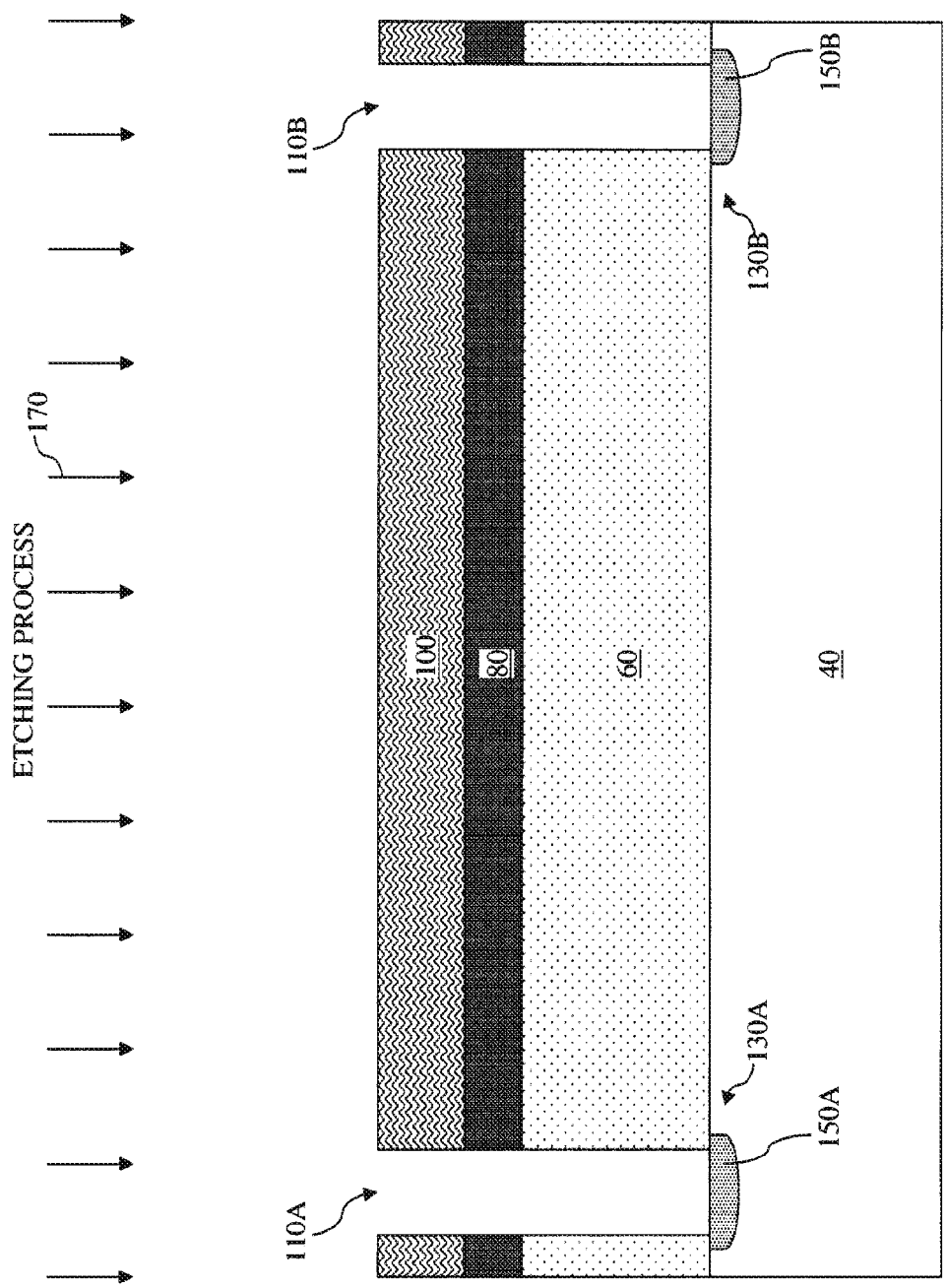

Referring now to FIG. 13, an etching process 170 is performed to extend the openings 110A-110B downward so as to expose the doped regions 150A-150B of the protection diodes 130A-130B. The doped regions 60A-9 and 80A-9 are removed by the etching process 170. Thereafter, a metal silicide layer (not illustrated herein) is formed on the exposed surfaces of the doped regions 150A-150B. The metal silicide layer may be a NiSi layer and may be formed by a deposition process followed by an annealing process and an etching process. The NiSi layer may optionally undergo an additional annealing process.

Figure 14:
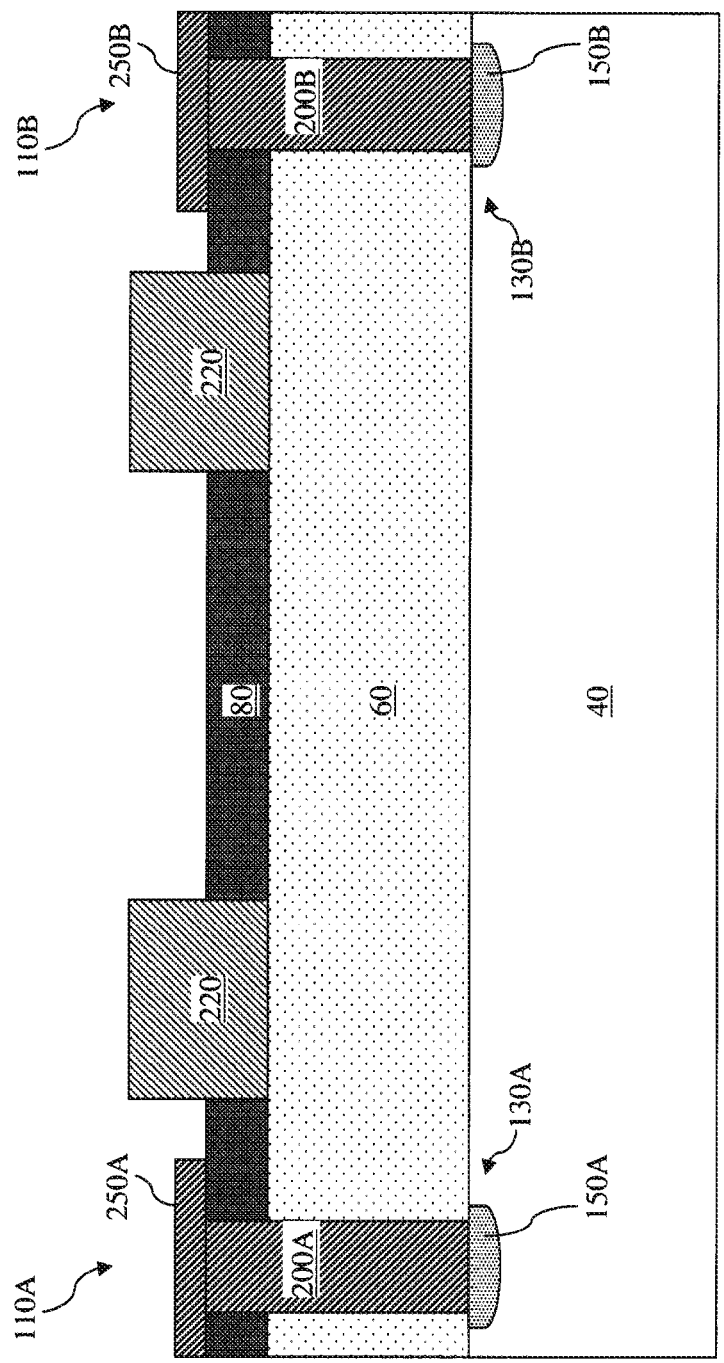

Referring now to FIG. 14, the patterned mask 100 is removed. The openings 110A-110B are then filled with a conductive material to form conductive vias 200A-200B that are electrically coupled to the protection diodes 130A-130B, specifically to the doped region 150A-150B. Metal contact pads 250A-250B are formed over the III-V compound layer 80. The metal contact pads 250A-250B are electrically coupled to the vias 200A-200B, and therefore are electrically coupled to the protection diodes 130A-130B. The metal contact pads 250A-250B are located adjacent to (or near) the source and drain components 220.

Source and drain regions 220 of a HEMT device are also formed over the III-V compound layer 60. In some embodiments, the source and drain regions 220 are formed by etching openings in the III-V compound layer 60 and filling these openings with a conductive material such as a metal material. The protection diodes 130A-130B are normally reverse biased. However, when there is a large amount of plasma charge, the protection diodes 130A-130B turn on and divert the charge to the silicon substrate 40, thereby preventing plasma-induced damage to the HEMT device.

Figure 15:
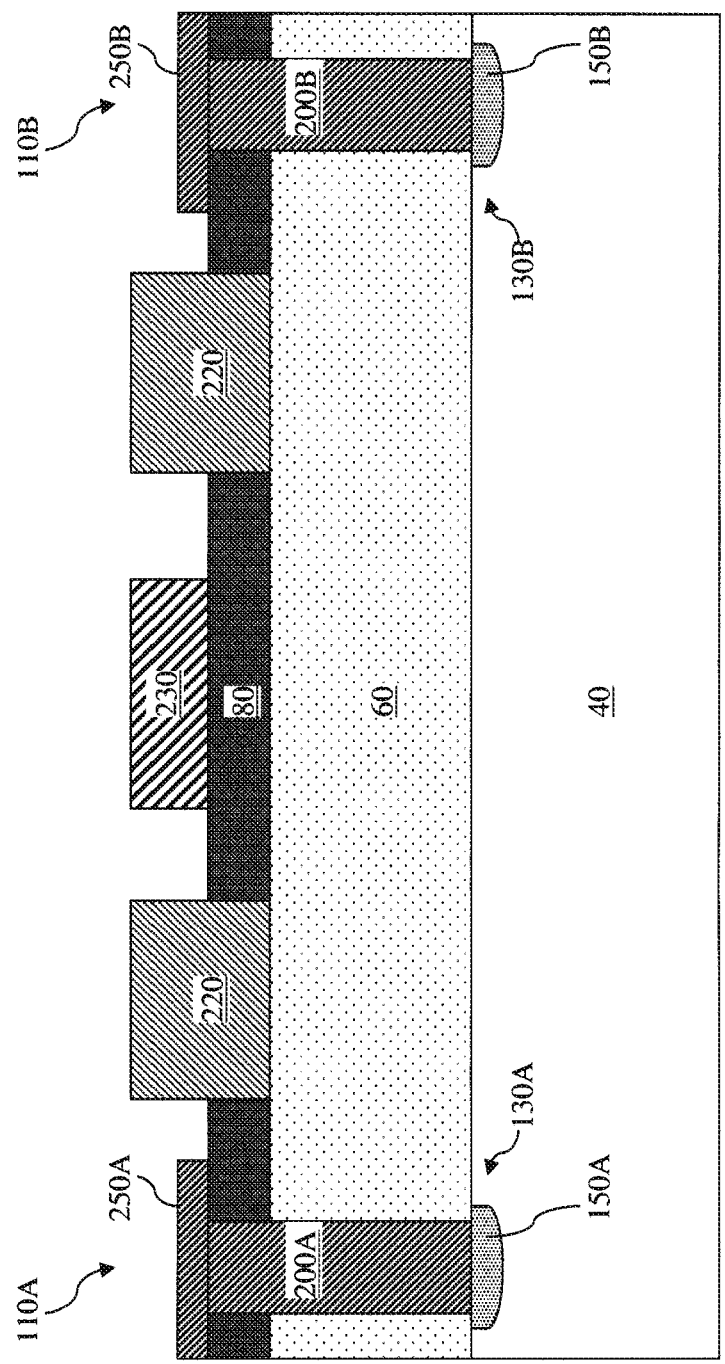

Referring now to FIG. 15, a gate component 230 of the HEMT device is formed over the III-V compound layer 80. The gate component 230 is formed between the source and drain components 220. The gate component 230 may include a gate dielectric and a conductive gate electrode.

Figure 16:
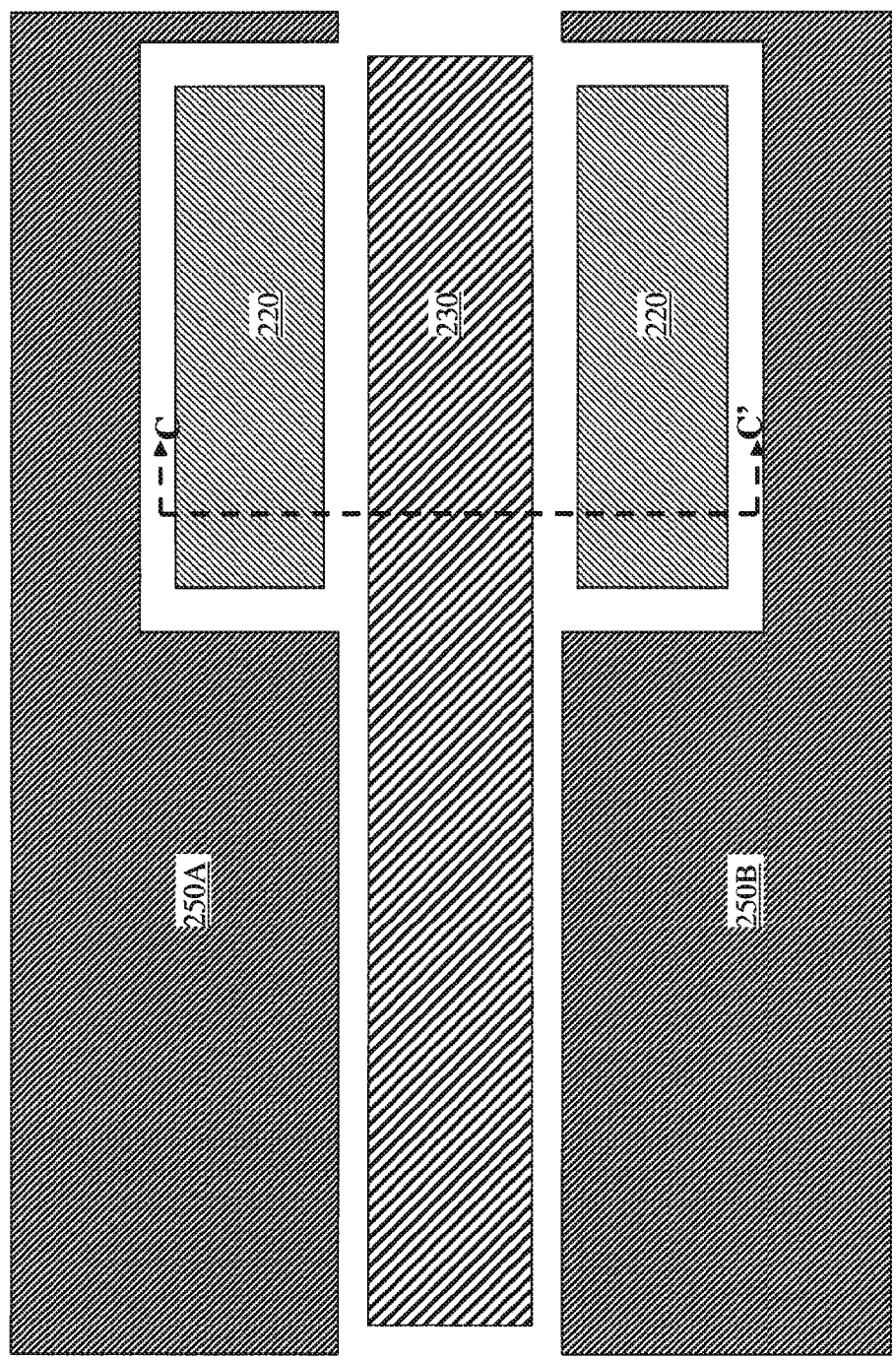
FIG. 16 is a diagrammatic fragmentary top view of a semiconductor device at a stage of fabrication in accordance with various aspects of the present disclosure.

FIG. 16 illustrates a fragmentary top view of the semiconductor device of FIG. 15. The cross-sectional view of FIG. 15 is obtained by taking a cross-section cut from point C to C' in FIG. 16. One of the source and drain components 220 is located on one side of the gate 230, and the other one of the source and drain components 220 is located on the opposite side of the gate 230. The gate component 230 and the source and drain components 220 collectively make up the HEMT device. The vias 200A-200B are not directly visible in the top view, because they are covered up by the metal pads 250A-250B. In the illustrated embodiment, the metal pads 250A-250B at least partially surround the HEMT device (i.e., including the gate component 230 and the source and drain components 220). As such, the diodes 130A-130B may be considered as at least partially surrounding the HEMT device. In alternative embodiments, the metal pads 250A-250B may completely surround the HEMT device (e.g., in a circumferential manner).

It is understood that additional fabrication processes may be performed to complete the fabrication of the semiconductor device 40. For example, these additional fabrication processes may include formation of interconnect structures, passivation, packaging, wafer dicing/slicing, and testing processes. For the sake of simplicity, these additional processes are not described herein.

The embodiments of the present disclosure offers advantages, it being understood that different embodiments may offer different advantages, and not all the advantages are discussed herein, and that no particular advantage is required for all embodiments. One of the advantages of certain embodiments of the present disclosure is that, the protection diodes can effectively prevent plasma-induced damage to the HEMT device. For example, the protection diodes turn on when there is a large amount of plasma charge and can provide a conduit for diverting the plasma charge to the silicon substrate. Sensitive component of the HEMT device (such as the gate dielectric) is therefore spared of plasma-induced damage. Another advantage is that the protection diodes according to the embodiments discussed above causes minimal routing obstruction, as they are implemented in the silicon substrate and only need a via through the GaN layer to collect plasma charge. In addition, compared to certain conventional methods of protecting HEMT devices, the protection diodes discussed herein also saves layout area.

Though the discussions above use an HEMT device as an example, it is understood that the protection diodes discussed herein may also be implemented in other electronic devices whose fabrication involves forming a III-V compound layer over a silicon substrate, for example light-emitting diode (LED) devices, radio frequency (RF) devices, or high power semiconductor devices.

One of the broader forms of the present disclosure involves a semiconductor device. The semiconductor device includes: a High Electron Mobility Transistor (HEMT) device formed at least partially in a III-V compound layer over a silicon substrate; and a diode formed in the silicon substrate, the diode being electrically coupled to one of: the HEMT device, and a contact pad disposed adjacent to the HEMT device.

In some embodiments, the III-V compound layer includes: a gallium nitride (GaN) buffer layer formed over the silicon substrate; and an aluminum gallium nitride (AlGaN) layer formed over the GaN buffer layer.

In some embodiments, the HEMT device includes: a conductive gate component formed over the AlGaN layer; a conductive source component formed at least partially in the AlGaN layer; and a conductive drain component formed at least partially in the AlGaN layer, the gate component being disposed between the source component and the drain component.

In some embodiments, the diode is electrically coupled to the gate component through a via that extends through the GaN buffer layer and the AlGaN layer.

In some embodiments, the gate component includes a gate extension segment that extends beyond the source component and the drain component; and the via is coupled to the gate extension segment.

In some embodiments, the diode is electrically coupled to the source component through a via that extends through the GaN buffer layer.

In some embodiments, the contact pad is formed over the AlGaN layer; and the diode is electrically coupled to the contact pad through a via that extends through the GaN buffer layer and the AlGaN layer.

In some embodiments, the contact pad at least partially surrounds the HEMT device in a top view.

Another of the broader forms of the present disclosure involves a semiconductor device. The semiconductor device includes: a silicon substrate; a first III-V compound layer being disposed over the silicon substrate; a second III-V compound layer being disposed over the first III-V compound layer; a transistor being disposed over the first III-V compound layer and partially in the second III-V compound layer; a diode being disposed in the silicon substrate; and a via being coupled to the diode and extending through at least the first III-V compound layer, wherein the via is electrically coupled to the transistor or disposed adjacent to the transistor.

In some embodiments, the first III-V compound layer contains gallium nitride (GaN); and the second III-V compound layer contains aluminum gallium nitride (AlGaN).

In some embodiments, the transistor is a High Electron Mobility Transistor (HEMT) device and includes: a source and a drain each partially disposed in the second compound layer; and a gate disposed between the source and drain and over the second III-V compound layer.

In some embodiments, one end of the via is coupled to the diode; and an opposite end of the via is coupled to one of: the gate and the source of the HEMT device.

In some embodiments, the via is not aligned with the source or the drain.

In some embodiments, one end of the via is coupled to the diode; and an opposite end of the via is coupled to a metal contact pad disposed over the second III-V compound layer, wherein the metal contact pad at least partially surrounds the transistor in a top view.

Still another of the broader forms of the present disclosure involves a method of fabricating a semiconductor device. The method includes: providing a silicon substrate having a III-V compound layer disposed thereon; forming a diode in the silicon substrate through an ion implantation process, the diode being formed proximate to an interface between the silicon substrate and the III-V compound layer; etching an opening through the III-V compound layer to expose the diode; filling the opening with a conductive material, thereby forming a via that is coupled to the diode; and forming a High Electron Mobility Transistor (HEMT) device at least partially in the III-V compound layer.

In some embodiments, the III-V compound layer includes a gallium nitride sub-layer and an aluminum gallium nitride sub-layer disposed over the gallium nitride sub-layer.

In some embodiments, the forming the HEMT device includes: etching recesses in the III-V compound layer; filling these recesses with a conductive material, thereby forming source/drain components of the HEMT device; forming a gate component of the HEMT device over the III-V compound layer and between the source/drain components.

In some embodiments, the forming the HEMT device is performed in a manner such that the via is electrically coupled to a gate component of the HEMT device.

In some embodiments, the forming the HEMT device is performed in a manner such that the via is electrically coupled to a source component of the HEMT device.

In some embodiments, the forming the HEMT device is performed in a manner such that the via is electrically coupled to a metal contact pad disposed over then III-V compound layer, wherein the metal contact pad at least partially surrounds the HEMT device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep n-well pocket for isolating the device.

What is claimed is:

1. A semiconductor device, comprising:
a transistor device disposed at least partially over a III-V compound layer;
a conductive via disposed below the transistor; and
a diode electrically coupled to the transistor through the conductive via, wherein the diode includes:
a first doped portion that is disposed below and electrically coupled to the via; and
a second doped portion that surrounds the first doped portion except an upper surface of the first doped portion, wherein the first doped portion and the second doped portion have different types of conductivity.

2. The semiconductor device of claim 1, wherein:
the transistor includes a source, a drain, and a gate;
the gate is disposed between the source and the drain in a top view; and
a portion of the gate extends beyond the source and the drain in the top view.

3. The semiconductor device of claim 2, wherein at least a portion of the source and the drain are located within the III-V compound layer.

4. The semiconductor device of claim 1, wherein:
the diode is under reverse bias when an amount of plasma, charge of the transistor is below a threshold; and
the diode turns on when the amount of plasma charge exceeds the threshold, thereby diverting the plasma charge to a substrate surrounding the diode.

5. The semiconductor device of claim 1, wherein the conductive via is in direct contact with a gate of the transistor.

6. The semiconductor device of claim 1, wherein the conductive via is in direct contact with a source/drain of the transistor.

7. The semiconductor device of claim 1, wherein the conductive via is in direct contact with a metal pad that is disposed over the III-V compound layer and adjacent to a source/drain of the transistor.

8. The semiconductor device of claim 7, wherein the conductive via is a first conductive via, the metal pad is a first metal pad, and the diode is a first diode, and wherein the semiconductor device further comprises a second diode, a second metal pad, and a second conductive via, and wherein the second diode is electrically coupled to the second metal pad through the second conductive via.

9. The semiconductor device of claim 8, wherein the first metal pad and the second metal pad partially surround the transistor in a top view.

10. The semiconductor device of claim 1, wherein the transistor comprises a high electron mobility transistor (HEMT) device, a light-emitting diode (LED) device, a radio frequency (RF) device, or a high power device.

11. The semiconductor device of claim 1, further comprising a buffer layer disposed between the III-V compound layer and the diode, the buffer layer and the III-V compound layer having different material compositions.

12. The semiconductor device of claim 11, wherein:
the buffer layer contains gallium nitride (GaN); and
the III-V compound layer contains aluminum gallium nitride (AlGaN).

13. A semiconductor device, comprising:
a III-V compound layer disposed over a substrate;
a transistor device disposed at least partially over a III-V compound layer, wherein the transistor includes a source, a drain, and a gate;
a conductive via that is electrically coupled to the gate, the source, the drain, or a metal pad disposed over the III-V compound layer; and
a diode disposed in the substrate, wherein the diode is electrically coupled to the transistor through the conductive via, wherein the diode includes:
a first doped portion that is disposed below and electrically coupled to the via; and
a second doped portion that at least partially surrounds the first doped portion, one of the first and second doped portions is doped with an n-type dopant, and the other one of the first and second doped portions is doped with a p-type dopant.

14. The semiconductor device of claim 13, wherein:
a segment of the gate extends beyond the source and the drain in a top view; and
at least a portion of the source and the drain are embedded within the III-V compound layer.

15. The semiconductor device of claim 13, wherein:
the diode is reverse biased when an amount of plasma charge of the transistor is below a threshold; and
the diode turns on when the amount of plasma charge exceeds the threshold, thereby diverting the plasma charge to the substrate.

16. The semiconductor device of claim 13, wherein the conductive via is in direct physical contact with the gate, the source, the drain, or the metal pad.

17. The semiconductor device of claim 13, wherein the III-V compound layer contains aluminum gallium nitride (AlGaN), and wherein the semiconductor device further comprising a gallium-nitride-containing layer disposed between the III-V compound layer and the substrate.

18. A semiconductor device, comprising:
a III-V compound layer disposed over a substrate;
a protection diode formed in the substrate, wherein the protection diode includes a first portion and a second portion that has different type of conductivity than the first portion; and
a transistor device disposed at least partially over a III-V compound layer, wherein the transistor includes a source, a drain, and a gate;
wherein:
the protection diode is electrically coupled to the transistor and only turns on to divert an amount of plasma charge of the transistor to the substrate.

19. The semiconductor device of claim 18, wherein the protection diode is electrically coupled to the transistor through a conductive via that is in direct physical contact with the protection diode, the conductive via extending through the III-V compound layer.

20. The semiconductor device of claim 18, wherein:
the gate of the transistor is longer than the source and the drain of the transistor in a top view; and
portions of the source and the drain are located in openings formed in the III-V compound layer.

* * * * *